(12) United States Patent
Daffron et al.

(10) Patent No.: US 6,181,187 B1
(45) Date of Patent: Jan. 30, 2001

(54) CIRCUIT FOR AUTO-CENTERING CONTROL LOOP BIAS CURRENTS

(75) Inventors: Christopher J. Daffron, Tustin; James M. Aralis, Mission Viejo, both of CA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/410,121

(22) Filed: Sep. 30, 1999

(51) Int. Cl.$^7$ ........................................ H03L 5/00
(52) U.S. Cl. ............................ 327/323; 327/87; 327/361
(58) Field of Search .................... 327/87, 88, 89, 327/323, 332, 361, 363

(56) References Cited

U.S. PATENT DOCUMENTS 4,456,840 * 6/1984 Ide et al. ............................ 307/362
5,892,376 * 4/1999 Tabatabai et al. ..................... 327/73
6,072,339 * 6/2000 Bertolini ............................. 327/54

* cited by examiner

Primary Examiner—Jung Ho Kim
(74) Attorney, Agent, or Firm—Bret J. Petersen; Frederick J. Telecky, Jr.

(57) ABSTRACT

A method and circuit for automatically centering the control loop bias current by sensing and "memorizing" the total steady state bias current used by the function block (VGA or VCO) through the use of both digital and analog memory elements. The present invention uses an auto-centering, high-impedance current driver to supply the bias current. This current driver cancels out offset currents by exploiting the high output impedance nature of a CMOS current driver using cascoded or resistor source de-generated FET devices.

11 Claims, 1 Drawing Sheet

US 6,181,187 B1

CIRCUIT FOR AUTO-CENTERING CONTROL LOOP BIAS CURRENTS

CROSS-REFERENCE TO RELATED APPLICATIONS

The following co-assigned and co-filed patent application, filed Sep. 30, 1999, is incorporated herein by reference:

| Number | Inventors | Title |
| --- | --- | --- |
| 09/409640 | Daffron, Christopher J. Aralis, James M. | A Circuit for Auto-Zeroing A High Impedance CMOS Current Driver |

FIELD OF THE INVENTION

This invention generally relates to control loop bias currents. More particularly, it relates to a circuit for auto-centering a control loop bias current using a high impedance CMOS current driver.

BACKGROUND OF THE INVENTION

Many important system level circuit functions, such as automatic gain control (AGC) and phase-locked loops (PLL), use the general control loop as shown in FIG. 1. The function block 10 would consist of a variable gain amplifier (VGA) in the case of a AGC loop, or a voltage controlled oscillator (VCO) in the case of a PLL system. The bias 12 to the function block 10 is controlled by a feedback loop ($V_{sense}$) 14 which senses the current state of the function block, and compares it to the desired state ($V_{ref}$) 16 resulting in an adjustment of the bias $I_{Bias}$ 12 by $I_{Error}$ 18 provided by the Gm block 20. The digital-to-analog converter (DAC) 22 generates the main bias current ($I_{Center}$) 24 to the function block 10, and is adjustable through an external register. This programmable DAC extends the operational range of the function block, as well as, limits the gain and range of the Gm block needed for proper control loop functionality.

In the circuit described above, it is desirable to keep the Gm block operating at or near its zero differential operating point in order to maintain its optimal linearity and noise rejection characteristics. The farther the center current is from the desired bias current, the greater error current the Gm block must provide, and therefore must deviate from it's optimal operational point. If the DAC block could adjust or "adapt" the centering current, for which it provides, to the changing bias current needs of the function block, then the Gm block would need only provide the transitory error current for the loop during the acquisition period, and would always operate at it's zero differential point during steady state.

SUMMARY OF THE INVENTION

The present invention provides a method and circuit for automatically centering the control loop bias current by sensing and "memorizing" the total steady state bias current used by the function block (VGA or VCO) through the use of both digital and analog memory elements.

The present invention uses an auto-zeroing, high-impedance current driver to supply the bias current. This current driver cancels out offset currents by exploiting the high output impedance nature of CMOS current drivers as described in the cofiled application cited above. The invention uses cascoded or resistor source degenerated FET devices to create two very high impedance current sources. The mismatch between the bias currents is balanced to reduce the offset current using an auto-zeroing circuit.

An advantage of the present invention is the non-intrusive nature of the digital centering. Prior art circuits typically would cause transitions on the bias current input to the function block upon completion of updating the digital portion of the centering current. Advantageously, in the present invention the bias current is held constant while updating the digital portion of the bias current. Thus, when the bias current loop is closed and the bias current is again allowed to adjust with the feedback from the function block there is no transition on the bias current. This is particularly advantageous where the function block continues to operate during the auto-centering process.

Another advantage of the present invention is its versatility. The auto-centering control loop bias current can be used for common control loops such as phase locked loops and automatic gain control circuits.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
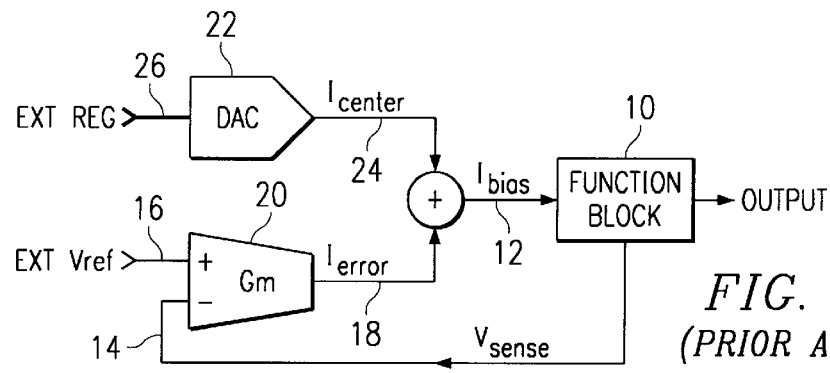
FIG. 1 A basic circuit diagram for a control loop according to the prior art.
Figure 2:
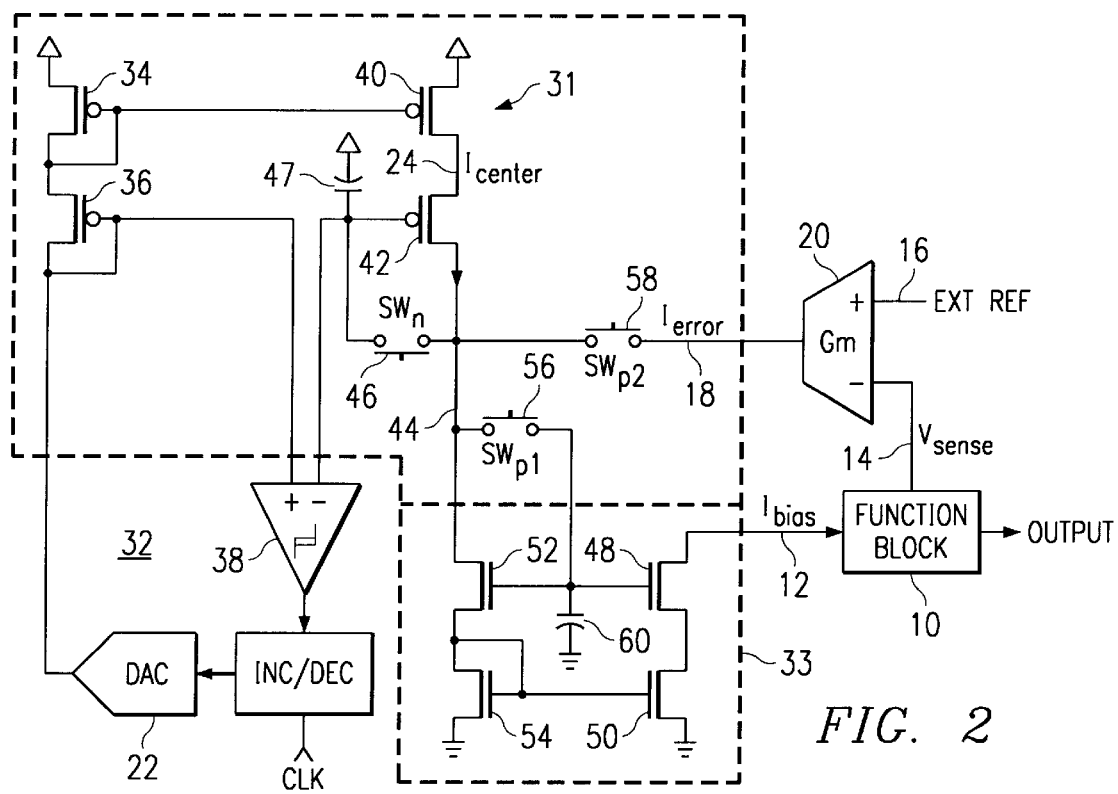
FIG. 2 A control-loop circuit having an auto-centering circuit according to an embodiment of the present invention.
Figure 3:
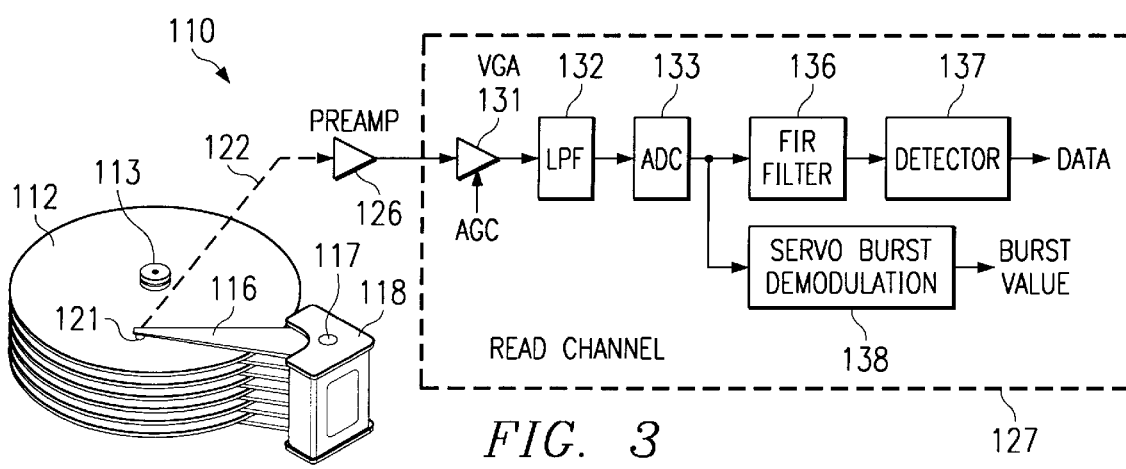
FIG. 3 A hard disk drive having an auto-centering circuit according to an embodiment of the present invention.

The preferred embodiment of the present invention is best understood by referring to FIGS. 1–3 of the drawings, like numerals are used for like and corresponding parts of the various drawings.

FIG. 2 illustrates a circuit block diagram for a control loop circuit having an auto-centering circuit to provide a bias current according to a preferred embodiment of the present invention. The control loop circuit of FIG. 2 includes the same basic structure as FIG. 1. The function block 10 could, for example, consist of a variable gain amplifier (VGA), or a voltage controlled oscillator (VCO). The bias current 12 to the function block 10 is controlled by a feedback loop. The feedback loop senses the current state of the function block ($V_{Sense}$ 14), and compares it to the desired state $V_{ref}$ 16 resulting in an adjustment of the bias $I_{Bias}$ by $I_{Error}$ 18 provided by the Gm block 20. The digital-to-analog converter (DAC) 22 generates the main bias current $I_{center}$ 24 to the function block 10 through the auto centering bias current circuit, which will be described below. The center current 24 is adjustable using the increment/decrement counter 28 and the comparator 30.

The auto-centering control loop bias circuit according to the embodiment shown in FIG. 2 has an adjustable center current circuit 31, a variable bias current generator circuit 32 and a current mirror circuit 33. The center current circuit, shown generally at 31 comprises a current source connected to the current mirror circuit to provide a control loop center bias current $I_{Center}$ that is combined with $I_{Error}$ and mirrored to the function block 10 as $I_{Bias}$.

The bias current generator circuit 32 supplies a current to the current mirror of the center current circuit 31. The bias current generator circuit 32 comprises a DAC 22, which sinks a current through PFETs 34, 36 of the center current circuit 31. The bias current generator circuit 32 includes a comparator 38 with one input tied to the top current source control input described below, and the second input to gate of PFET 36. The output of the comparator 38 is input to an increment/decrement or up/down counter 39. The counter 39 has a clock input, which is gated by the input from the comparator 38 to increment or decrement the counter when an imbalance is detected at the inputs comparator 38 inputs. The counter 39 has a parallel register output to the DAC 22.

The center current circuit 31 includes a current source comprising P type FET (PFET) devices 40, 42; with the top PFET 40 having its source connected to supply voltage V1, and the bottom PFET 42 having its drain connected to node 44. The gate of the bottom PFET 42 is connected to an input of the comparator 38 and to node 44 through switch SWn 46. The gate of PFET 42 is also connected to a gate capacitor 47, with the other terminal of the capacitor connected to a supply voltage V1. The center current circuit 31 includes PFETs 34,36, which are diode connected. PFET 34 has a source tied to V1 and a drain connected to the source of PFET 36. PFET 36 has a drain connected to DAC 10. The gate drain connection of the top PFET 34 provides a bias voltage to the gate of the top PFET 40 of the top current source of the center current circuit 31 that provides the $I_{Center}$ current.

The auto-centering control loop bias circuit according to the embodiment includes a current mirror circuit 33 as stated above. The current mirror circuit 33 includes cascoded NFETS 52, 54 connected to the $I_{Center}$ current source through node 44. NFET 54 is diode connected and its source connected to ground and drain connect to source of NFET 52. NFET 52 has a drain connected to node 44 and the gate connected to switch SWp1 56 so that NFET 52 can be diode connected when SWp1 is closed. The current mirror circuit 33 further includes a bottom current source composed of cascoded N type FET (NFET) devices 48, 50. NFET 48 has a source connected to the function block 10 to sink a current $I_{Bias}$. The gate of NFET 48 is connected to a second capacitor 60, to the gate of NFET 52 and to node 44 through switch SWp1 58. NFET 50 has its drain connected to the source of NFET 48 and source connected to ground, and a gate connected to the gate of NFET 54. The current mirror circuit 33 also includes switch SWp2 58, which closes the control loop by connecting node 44 to the $I_{Error}$ 18 from the Gm block 20.

During closed loop operation of the control loop, switch SWn 46 is open while switches SWp1 56 and SWp2 58 are closed. The center current 24 is provided by the cascoded PFET current source 40,42, which is largely controlled by the mirrored output current of the DAC 22. The center current is combined with the error current provided by the Gm block and is mirrored through the cascoded NFET current mirror providing the entire loop bias current to the function block. In this mode, the NFET devices are configured as a current mirror, which is "slaved" to the PFET devices that are configured as a high impedance current source. As the control loop acquires the required bias current, it adjusts the error current 18 while the center current 24 remains fixed.

During Adapt mode, or when the control loop is in open loop, switch SWn 46 is closed while switches SWp1 56 and SWp2 58 are open. The NFET devices 52, 54 are now configured as a current source, which retains the value of the bias current through the use of the gate capacitor 60. At the same time, the PFET devices are configured as a low impedance current source, which is now "slaved" to the NFET devices. The error current 18 is removed from the circuit by opening the control loop with SWp2 58. The centering current will adjust until it equals the NFET current sources, and hence will equal the bias current. The new center current will be the sum of the old center current and the old error current. Therefore, during the next acquisition of bias current, the error current should be reduced, bringing the Gm block closer to its optimal operation point. Once the control loop reaches steady state, the auto-centering circuit should be providing the entire bias current to the function block 10.

The detailed process by which the circuit "adapts" to the bias current stored on the NFET current source is now described. First, there is both an analog (continuous) adjustment, as well as, a digital (discrete) adjustment of the center current. The analog adjustment of current is controlled by the drain/source impedance of the top PFET device 40 in the PFET current source, and the gate voltage seen on the bottom PFET device 42. The gate voltage will adjust until the current in the PFET current source equals the current in the cascoded NFET current source. The gate capacitor 47 is used to retain this equalized current. During the auto-centering mode, SWn closes while SWp1 and SWp2 open. This configuration connects both the capacitor, and the gate of the lower PFET 42 in the upper current source 40, 42 to the high impedance output node 44. Since the current in the upper current source 40,42 can now only flow into the NFET current source 52, 54, the two currents will now be equal. Concurrently, the voltage at the output node 44 will settle to a value such that the voltage across the output impedances of each current source produces equal currents. Since the upper current source is no longer in the cascode configuration, its output impedance is reduced to the impedance of the top PFET 40 device. This output impedance will control the close loop gain and hence the amount of voltage swing on the output node during autozeroing. The resulting gate voltage is stored on the capacitor 47.

During the current equalization process, the hysteresis comparator monitors the gate voltage of the PFET 42 relative to the gate voltage of the gate voltage of PFET 36. If the difference in the gate voltages deviates beyond the threshold of the comparator, the digital counter, shown in FIG. 2, will increment or decrement accordingly. This will step the DAC to a new current setting that will reduce the gate voltage difference. This constitutes the digital portion of the current adjustment process. The portion of the total center current "memorized" by the analog circuit (capacitor 47) is dictated by the resolution of the digital memory (DAC, Flip-Flops in INC/DEC counter), and by the hysteresis of the comparator 38.

FIG. 3 is a diagrammatic view of part of a hard disk drive system 110 that embodies the present invention. The system 110 includes a plurality of magnetic disks 112, which are fixedly secured to a spindle 113 that is rotationally driven by a not-illustrated spindle motor. A plurality of arms 116 are supported for pivotal movement about an axis defined by a pivot axle 117, pivotal movement of the arms 116 being effected under control of a voice coil motor 118. At the outer end of each arm is a read/write head 121. The head 121 includes respective portions that serve as a read head and a write head.

As shown diagrammatically at 122, the output of the read head is coupled to an input of a preamplifier 126. The output of the preamplifier 126 is coupled to an input of a read channel circuit 127. The read channel circuit 127 includes a variable gain amplifier (VGA) 131, which facilitates an automatic gain control (AGC) function. The input to the VGA 131 is coupled to the output of the preamplifier b, and the output of the VGA 131 is coupled to an input of a low pass filter (LPF) 132. The output of the LPF 132 is coupled to the input of an analog-to-digital converter (ADC) 133. The output of the ADC 133 is coupled to an input of a finite input response (FIR) filter 136, the output of which is coupled to an input of a digital data detector 137.

The output of the ADC 133 is also coupled to an input to a servo burst demodulation circuit 138. Alternatively, the input to the servo burst demodulation circuit 138 could be coupled to the output of the FIR filter 136, rather than to the output of the ADC 133. The outputs of the detector circuit 137 and demodulation circuit 138 are both coupled to a not-illustrated control circuit, such as a digital signal processor.

The information stored on the magnetic disk 112 is organized in the form of a plurality of circular tracks that are arranged concentrically with respect to each other. Pivotal movement of the arm 116 causes the head 121 to move radially of the disk 112, so that the head can be radially aligned with a selected one of the tracks. Each of the tracks has portions that store data, and portions that store servo information. The servo information allows the system to identify a selected track, and to achieve and maintain radial alignment of the head 121 with that selected track.

In the present invention, the circuit of FIG. 2 would reside in VGA block 131. The auto-centering control loop bias circuit would allow the VGA 131 to adjust the gain of the pre-amp signal to maximize the dynamic range of the ADC 133. Thus the auto-centering control loop bias circuit would adjust the bias current 12 by closing SWp1 56 and SWp2 58 and opening SWn 46 as described above. This adjustment would typically be done when the disk head 121 is over the AGC field in the data structure of the disk tracks as is well known in the art of disk drives.

Finally, it is noted that FETs, combined with source degenerating resistors, could have replaced all of the cascoded current sources, shown in the figures, and all aspects of the invention would still apply. Further, the illustrated embodiments do not show the control circuitry that would control the switches for the reset and auto-zeroing operations. It is contemplated that this functionality and structure is easily within the ability and knowledge of those skilled in this art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for auto-centering a control loop bias current comprising:
   a. a current source connected to a common node;
   b. a first switch operable to connect the common node to an error current input;
   c. a second switch operable to connect a first terminal of a capacitor to the common node and charge the capacitor to a voltage on the common node when the first switch is open;
   d. an input to the current source connected to the first terminal of the capacitor to adjust the current source current using a voltage on the capacitor;
   e. a current mirror circuit connected to the common node to output a bias current to a control loop, where the bias current is the sum of the current through the first current source and the error current input at the common node; and
   f. a bias current generator circuit that generates a digital bias current to the current source.

2. The circuit for auto-centering a control loop bias current according to claim 1, wherein the bias current generator circuit comprises a digital-to-analog-converter connected to provide a bias current to the current source.

3. The circuit for auto-centering a control loop bias current according to claim 2, wherein the bias current generator circuit further comprises a digital counter connected to the digital-to-analog-converter and a comparator connected to the digital-to-analog-converter with the comparator having an input connected to the capacitor.

4. The circuit for auto-centering a control loop bias current according to claim 1, wherein the current mirror to output a bias current to a control loop comprises an NFET current source connected to the current mirror.

5. The circuit for auto-centering a control loop bias current according to claim 4, wherein the current mirror further comprises two diode connected NFETs with the top NFET diode connected when a third switch is closed, and wherein the NFET current source comprises two cascoded NFETs, with the gate of the top NFET of the NFET current source connected to the gate of the top diode connected NFET of the current mirror and to the common node through the second switch.

6. A hard disk drive for a computer system comprising:
   at least one disk and a head for reading magnetically stored data on the disk;
   a pre-amplifier to output an electrical signal representing the data stored on the disk detected by the head;
   a variable gain amplifier for adjusting the gain of the electrical signal from the pre-amp, the variable gain amplifier having a circuit for auto-centering a control loop bias current comprising:
   a. a current source connected to a common node;
   b. a first switch operable to connect the common node to an error current input;
   c. a second switch operable to connect a first terminal of a capacitor to the common node and charge the capacitor to the voltage on the common node when the first switch is open;
   d. an input to the current source connected to the first terminal of the capacitor to adjust the current source current using a voltage on the capacitor;
   e. a current mirror circuit connected to the common node to output a bias current to a control loop, where the bias current is the sum of the current through the first current source and the error current input at the common node; and
   f. a bias current generator circuit that generates a digital bias current to the first current source.

7. The disk drive according to claim 5, wherein the bias current generator circuit comprises a digital-to-analog-converter connected to provide a bias current to the current source.

8. The disk drive according to claim 7, wherein the bias current generator circuit further comprises a digital counter connected to the digital-to-analog-converter and a comparator connected to the digital-to-analog-converter with the comparator having an input connected to the capacitor.

9. The disk drive according to claim 6, wherein the current mirror to output a bias current to a control loop comprises an NFET current source mirror connected to the current mirror.

10. The disk drive according to claim 9, wherein the current mirror further comprises two diode connected NFETs with the top NFET diode connected when a third switch is closed, and wherein the NFET current source comprises two cascoded NFETs, with the gate of the top NFET of the NFET current source connected to the gate of the top diode connected NFET of the current mirror and to the common node through the second switch.

11. A circuit for auto-centering a control loop bias current comprising:

a. a current source to supply a bias current to a control loop;

b. an analog bias current circuit for the current source;

c. a digital bias current circuit for the current source;

d. wherein the digital bias current is adjusted to include an error current of the control loop within the digital resolution of the digital bias current circuit elements, and wherein the bias current to the control loop does not transition from its previous value before the auto-centering when the auto-centering of the circuit is completed and the control loop bias current is allowed to adjust with the error current.

* * * * *